(12) United States Patent
Matsui

(10) Patent No.: US 6,404,505 B2
(45) Date of Patent: *Jun. 11, 2002

(54) POSITIONING STAGE SYSTEM AND POSITION MEASURING METHOD

(75) Inventor: Shin Matsui, Urawa (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/287,262

(22) Filed: Apr. 7, 1999

(30) Foreign Application Priority Data

Apr. 8, 1998 (JP) .......................... 10-112798

(51) Int. Cl.$^7$ .............................................. G01B 11/00
(52) U.S. Cl. ...................... 356/620; 356/487; 356/517; 356/400; 356/500
(58) Field of Search .................. 356/375, 399, 356/400, 401, 509, 345, 356, 358, 500; 430/22, 30; 250/548; 355/53, 72, 75, 43, 45, 76, 55; 378/34

(56) References Cited

U.S. PATENT DOCUMENTS 3,796,494 A * 3/1974 Takabayashi
4,984,891 A * 1/1991 Miyazaki et al. ............ 356/358
5,151,749 A * 9/1992 Tanimoto et al. ........... 356/375
5,469,260 A * 11/1995 Takagi et al. ............... 356/358
5,537,209 A * 7/1996 Lis .............................. 356/349
5,883,932 A   3/1999 Chiba et al. ................. 378/34
5,930,324 A   7/1999 Matsui et al. ................ 378/34
6,049,372 A * 4/2000 Kato et al. .................... 355/53

FOREIGN PATENT DOCUMENTS

JP          6-163354          6/1994

* cited by examiner

Primary Examiner—Hoa Q. Pham
(74) Attorney, Agent, or Firm—Fitzpatrick, Cella, Harper & Scinto

(57) ABSTRACT

A positioning stage system includes a first stage movable at least in one of a rotational direction and a tilt direction, a second stage movable at least in X and Y directions, a measurement mirror system fixed to the second stage, a reference mirror system disposed on the first stage, and a measuring system for measuring displacement of the measurement mirror system in the X or Y direction, while using the reference mirror system as a positional reference, wherein the reference mirror system is arranged so that laser light incident on the reference mirror system is reflected in the same direction as the incidence direction, substantially constantly.

8 Claims, 8 Drawing Sheets

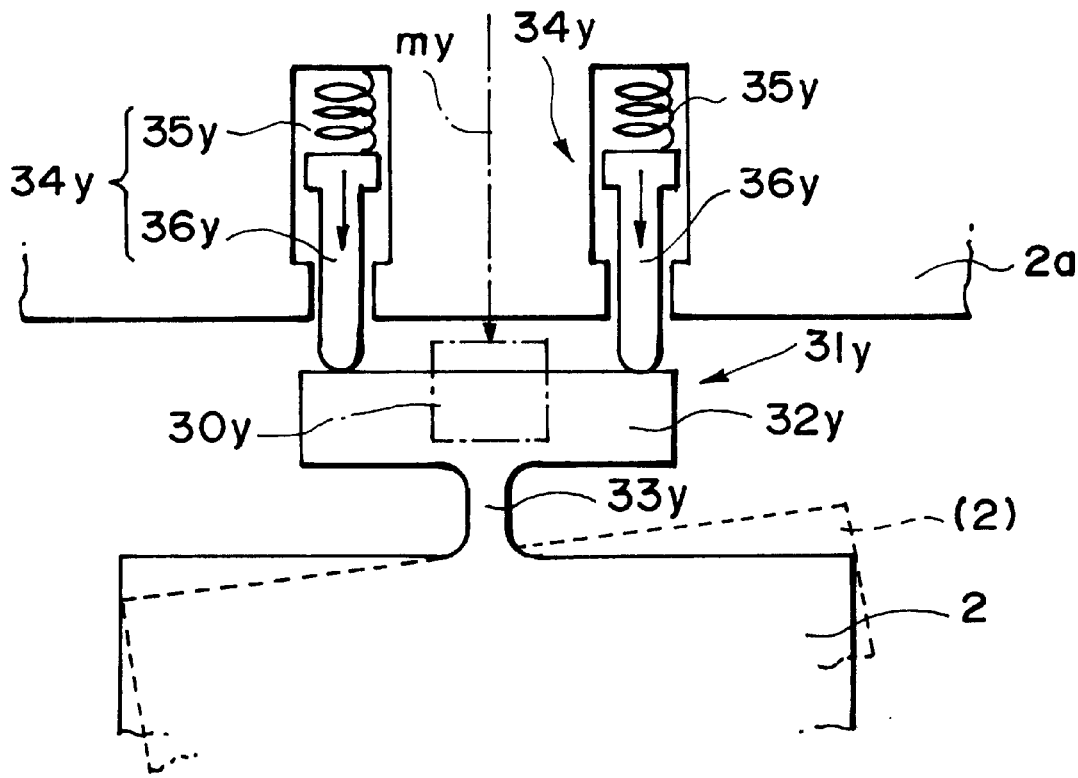
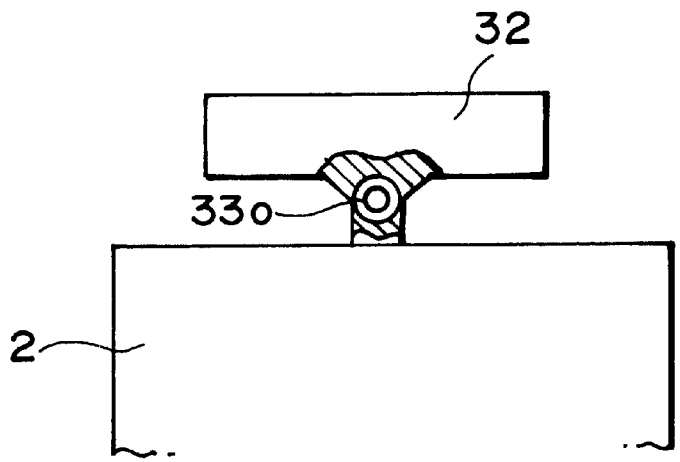 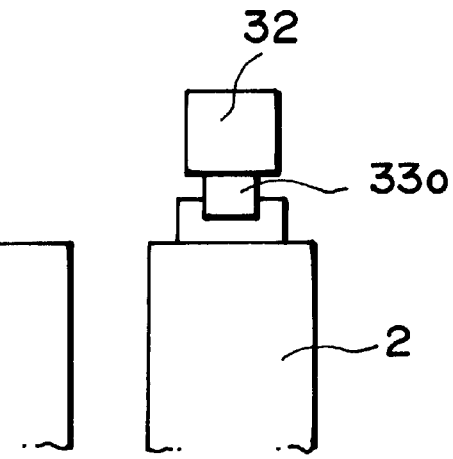
F I G. 3

POSITIONING STAGE SYSTEM AND POSITION MEASURING METHOD

FIELD OF THE INVENTION AND RELATED ART

This invention relates to a positioning stage system and a position measuring method usable in an exposure apparatus, for example, for manufacturing of semiconductor devices, for example. According to another aspect, the invention is concerned with an exposure apparatus having such a positioning stage system.

With further miniaturization and increasing density of a semiconductor chip due to enlargement of integration of semiconductor devices, a very narrower linewidth has been desired. For a semiconductor device of 1 GDRAM, for example, it should have a linewidth of 0.18 micron. As regards the registration of printed patterns, it should be 80 nm for a semiconductor device of 256 MDRAM and 60 nm for a semiconductor device of 1 GDRAM.

Exposure apparatuses for lithographically transferring a pattern formed on a mask to a substrate such as a wafer, are also required to provide high precision and good linewidth precision. While i-line or KrF laser are used as exposure light, to prevent degradation of resolution due to diffraction, a proximity exposure apparatus based on step-and-repeat process and using X-rays of shorter wavelength has been proposed.

A proximity exposure apparatus performs an exposure process while keeping a wafer, held on a wafer stage, close at a small gap of about 10–50 microns to a mask. The wafer stage is moved in X and Y directions to move stepwise exposure shots on the wafer to an exposure region, opposed to the mask, sequentially. Alignment measurement for the mask and wafer is performed by using an alignment optical system, and then an X-ray beam (exposure light) is projected to the mask whereby the pattern formed on the mask is transferred to the wafer.

In such exposure apparatus, it is important to position a mask and a wafer precisely. A high precision positioning stage system is therefore necessary. As a measuring system for a wafer positioning stage, a laser interferometer capable of measuring the movement amount of a movable member with high precision may be used.

Such a laser interferometer generally includes a laser oscillator (laser head) for emitting laser light, a measuring mirror mounted on a positioning stage to be measured, a reference mirror, which provides a measurement reference, an optical system having a polarization beam splitter, for example, for distributing the laser light from the laser oscillator to the measuring mirror and the reference mirror, and a photodetector. The laser light emitted from the laser oscillator is separated by the polarization beam splitter, so that a portion of the laser light passes through the polarization beam splitter and it is projected on the measuring mirror mounted on the positioning stage, which is the target to be measured. The remaining portion of the laser light is reflected by the polarization beam splitter toward the reference mirror. Light reflected by this reference mirror goes through the polarization beam splitter, while light reflected by the measuring mirror is reflected by the polarization beam splitter, whereby both are directed to and detected by the same photodetector. These laser lights to be detected by the photodetector interfere with each other to produce interference fringes. The photodetector is used to count the fringes, on the basis of which the distance between the reference mirror and the measuring mirror is detected. In accordance with the result, the position or movement amount of the positioning stage (target of measurement) having the measuring mirror mounted thereon can be determined.

Here, the reference mirror provides a measurement reference, and preferably it should be fixed to a base member which is integrally connected with measuring optical components. Also, it should be disposed close, as much as possible, to a member (e.g., mask) on which a reference should inherently be defined. This reduces the effect of thermal expansion between them. For example, in a projection exposure apparatus using g-line or i-line as exposure light, a reference mirror for a wafer X-Y stage for moving the wafer stepwise to the exposure station may be fixed to a base member of a lens barrel (Japanese Laid-Open Patent Application, Laid-Open No. 163354/1994).

In an X-ray exposure apparatus of the proximity type wherein unit-magnification exposure is performed while holding a mask and a wafer close to each other, a measurement reference for a wafer X-Y stage may preferably be provided by a mask itself or a mask supporting member close to the mask.

In X-ray exposure apparatuses of the proximity type, generally, a mask, which should provide a reference, is mounted for small movement in a rotational direction or tilt direction relative to an X-Y measurement beam. For example, a mask supporting member for holding the mask is structured to have freedom in a rotational direction along the mask surface so that it can absorb a mask manufacturing error or conveyance error. Alternatively, it is structured to have freedom in a tilt direction along the mask surface so that it can absorb a wedge component of the mask. In such a structure, if the reference mirror is provided on the mask or mask supporting member, the mask or mask supporting member, which defines the measurement reference, is displaceable in the rotational direction or tilt direction relative to the X-Y measurement beam, such that accurate measurement is not assured. Further, movement of the mask produces other components in X and Y directions which, although they are small because they are based on a cosine error, may lead to the result that the projected measuring beam does not come back to the photodetector. In that case, the wafer stage positioning is not attainable. The reference mirror may be mounted on any immovable member disposed outside the mask holding member in an attempt to avoiding the above problem. However, then the distance to the mask become long, and there arises the problem of a non-negligible error due to thermal expansion.

SUMMARY OF THE INVENTION

It is accordingly an object of the present invention to provide a positioning stage system and a position measuring method, by which high-precision measurement and high-precision positioning are attainable constantly regardless of the displacement of a measurement reference for a laser interferometer.

It is another object of the present invention to provide an exposure apparatus having such a stage positioning system, or a device manufacturing method using such an exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3(a) is a schematic and enlarged view of a main portion of mirror posture correcting means in a stage positioning system according to the present invention.

FIGS. 3(b) and (c) are a schematic and front view and a schematic and side view, respectively, of other examples of mirror posture correcting means.

DESCRIPTION OF THE PREFERRED EMBODIMENTS

Preferred embodiments of the present invention will now be described with reference to the accompanying drawings.

Figure 1:
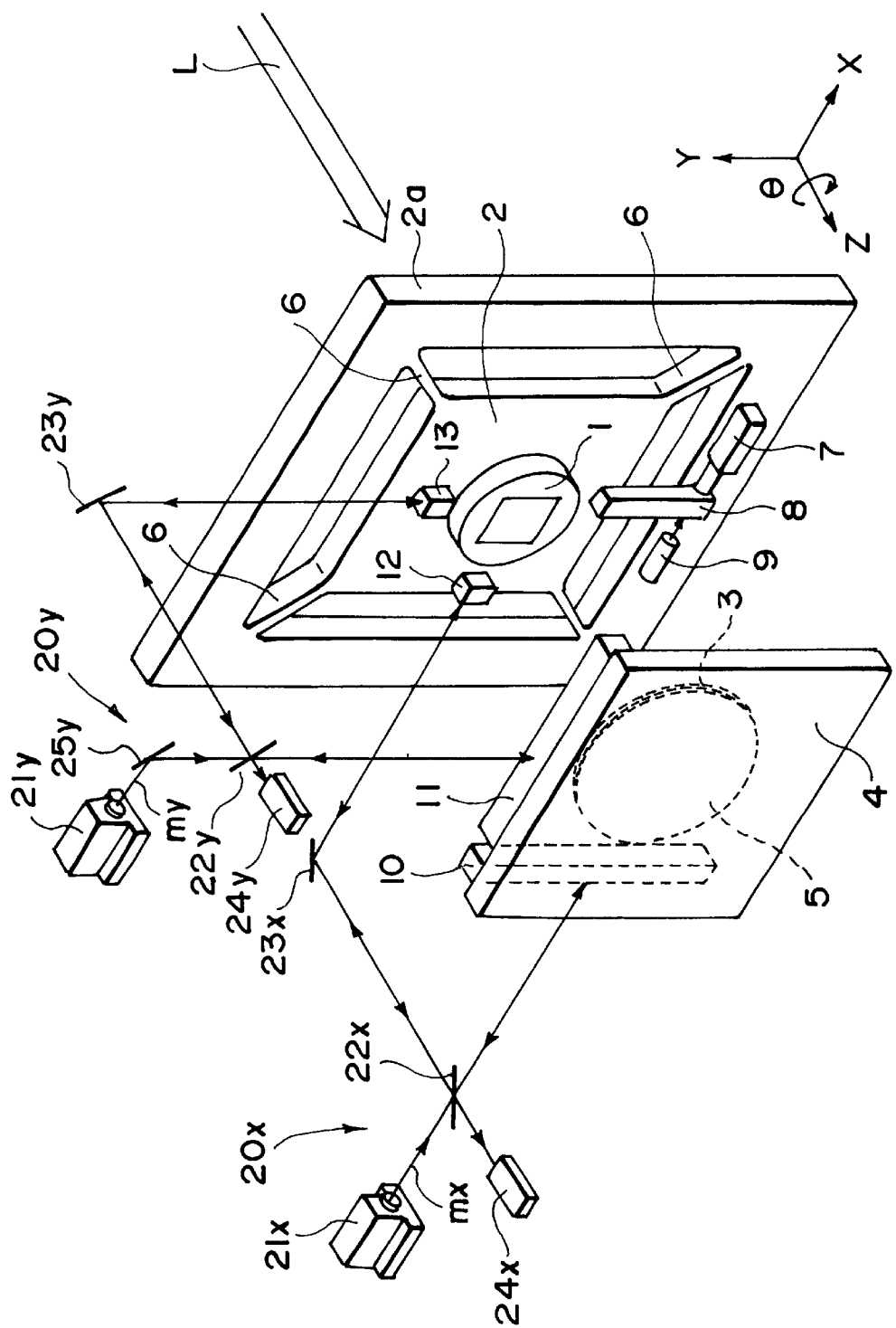
FIG. 1 is a schematic and perspective view of an embodiment wherein a stage positioning system according to the present invention is incorporated into an X-ray exposure apparatus.

FIG. 1 is a schematic and perspective view of an embodiment of a stage positioning system which is incorporated into an X-ray exposure apparatus.

In FIG. 1, along a path of X-ray beam L (exposure light) which is emitted from a light source (not shown), a mask θ stage 2 for holding a mask 1 and a wafer X-Y stage 4 for holding a wafer 3 (substrate) are disposed close to each other. The mask θ stage 2 for holding the mask 1 is supported, movably in a rotational (θ) direction, by a base plate 2a through leaf spring guides 6, 6, . . . , disposed at four corners. It can be rotationally driven in θ direction by θ driving means 7 and through an operating member 8 fixed to the mask θ stage 2. The angle θ thereof in the rotational direction can be detected by an angle sensor 9.

The wafer X-Y stage 4 has a wafer chuck 5 for holding the wafer 3, and it is made movable in X and Y directions along the wafer surface. It can be moved in X and Y directions, by driving means (not shown). At an end portion of the wafer X-Y stage 4 with respect to the X direction, there is an X-measurement mirror 10 mounted. At an end portion with respect to the Y direction, there is a Y-measurement mirror 11 mounted. Also, at the mask θ stage side, there are an X-reference corner cube 12 and a Y-reference corner cube 13 which function as reference mirrors with respect to X and Y directions, respectively. These corner cubes are disposed close to the mask 1 on the mask θ stage 2, or they are mounted on the mask 1.

For precise measurement of the wafer 3 position with respect to the mask 1, there are an X-axis laser interferometer 20x and a Y-axis laser interferometer 20y for measuring the position or movement amount of the wafer X-Y stage in X and Y directions. The X-axis laser interferometer 20x serves to measure the position of the wafer X-Y stage 4 with respect to the X direction. It comprises a laser oscillator (laser head) 21x for emitting measurement laser light mx, an X measuring mirror 10 mounted on the wafer X-Y stage 4 (target to be measured), an X-reference corner cube 12 for providing a measurement reference and being mounted on the mask θ stage 2, a polarization beam splitter 22x disposed between the laser oscillator 20x and the X measuring mirror 10, a right-angle mirror 23x for directing a portion of the laser light mx, being divided by the polarization beam splitter 22x, toward the X-reference corner cube 12, and a photodetector 24x. Thus, the, laser light mx emitted by the laser oscillator 21x is divided by the polarization beam splitter 22x. A portion of the laser light mx is transmitted through the polarization beam splitter 22x, and it is projected on the X measurement mirror 10 on the wafer X-Y stage 4. The remaining portion of the laser light mx is reflected by the polarization beam splitter 22x, and via the right-angle mirror 23x it is projected onto the X-reference corner cube 12 which provides a reference mirror. Light reflected by the X-reference corner cube 12 goes through the polarization beam splitter 22x, while light reflected by the X measurement mirror 10 is reflected by the polarization beam splitter 22x, and both lights are projected on the photodetector 24x. These laser lights projected on the photodetector 24x interfere with each other, to produce interference fringes. By counting the fringes with the photodetector 24x, the position and movement amount of the wafer X-Y stage 4 (target to be measured), having the X measurement mirror 10 mounted thereon, with respect to the X direction, can be measured.

The Y-axis laser interferometer 20y serves to measure the position and movement amount of the wafer X-Y stage 4 with respect to the Y direction. Similarly, it comprises a laser oscillator (laser head) 21y for emitting measurement laser light my, a Y measuring mirror 11 mounted on the wafer X-Y stage 4 (target to be measured), a Y-reference corner cube 13 for providing a measurement reference and being mounted on the mask θ stage 2, a polarization beam splitter 22y disposed between the laser oscillator 20y and the Y measuring mirror 11, a right-angle mirror 23y for directing a portion of the laser light my, being divided by the polarization beam splitter 22y, toward the Y-reference corner cube 13, and a photodetector 24y. Also, there is a right-angle mirror 25y for deflecting the laser light my, emitted from the laser oscillator 21y, to the polarization beam splitter 22y. Thus, the position and movement amount of the wafer X-Y stage 4 (target to be measured), having the Y measurement mirror 11 mounted hereon, with respect to the Y direction, can be measured through the Y-axis laser interferometer, similarly.

As described above, the corner cubes 12 and 13, which are reference mirrors for providing measurement references for the laser interferometer means 20 (20x and 20y), measuring the position or movement amount of the wafer X-Y stage 4 with respect to X or Y direction, are disposed adjacent to the mask 1 on the rotatable mask θ stage or provided on the mask 1 itself. As a result, when the mask θ stage 2 is rotationally driven through the θ driving means 7 so as to absorb a manufacturing error or conveyance error of the mask 1, even though the corner cubes 12 and 13 (reference mirrors) are rotated together therewith, it is assured that the corner cubes 12 and 13 reflect the incident laser light in the same direction. This assuredly prevents failure of impingement of reflected measurement laser light on the photodetector means 24 (24x and 24y) and thus failure of measurement. Therefore, even if the mask 9 stage 2 is rotated in the rotational direction along the mask surface, the position or movement amount of the wafer X-Y stage 4 with respect to the X or Y direction can be measured precisely, on the basis of the measurement reference provided by the corner cubes 12 and 13 (reference mirrors), which are disposed adjacent the mask 1 or on the mask 1 itself.

While this embodiment uses a corner cube for the reference mirror, in place of it, a cat's-eye having a reference mirror disposed at the lens focal point position may be used with similar advantageous effects. Further, this embodiment uses an optical system for distributing laser light, emitted from a laser oscillator, to reference mirrors, so that reflected lights from these mirrors are detected by one and the same photodetector. However, a laser interferometer having a reference mirror accommodated therein may be used. More specifically, with regard to the two reference mirrors, there may be two such independent laser interferometers, to measure the position or movement amount of the wafer X-Y stage.

Figure 2:
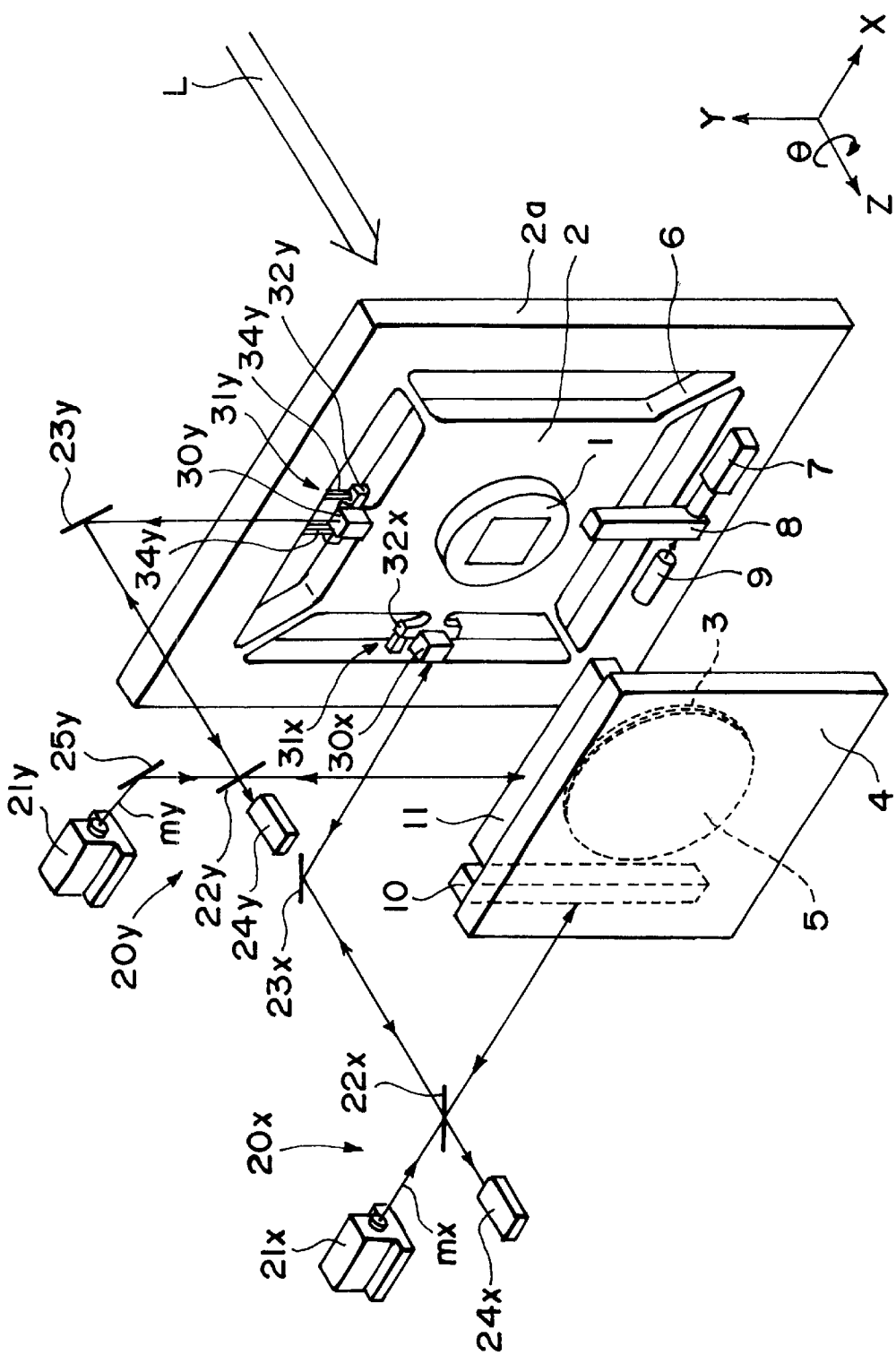
FIG. 2 is a schematic and perspective view of another embodiment wherein a stage positioning system according to the present invention is incorporated into an X-ray exposure apparatus.

Referring now to FIGS. 2 and 3, another embodiment of positioning stage system according to the present invention will be described.

FIG. 2 is a perspective view schematically showing a stage positioning system according to another embodiment of the present invention. This embodiment differs from the embodiment of FIG. 1 in that a reference mirror to be provided on a mask θ stage is mounted through mirror posture correcting means. In this embodiment, the elements corresponding to those of the FIG. 1 embodiment are denoted by like numerals. A detailed description therefor will be omitted.

In FIG. 2, an X-reference mirror 30x and a Y-reference mirror 30y are mounted on a mask θ stage 2 through X-mirror posture correcting means 31x and Y-mirror posture correcting means 31y, respectively. The positions of the X-mirror posture correcting means 31x and Y-mirror posture correcting means 31y mounted on the mask θ stage 2 are different, but they are structured with similar components. Like numerals are assigned to corresponding elements, with suffixes x and y.

Details of the Y-mirror posture correcting means 31y will now be explained, also in conjunction with FIG. 3A. The Y-mirror posture correcting means 31y comprises a Y-mirror fixing table 32y for fixing the Y-reference mirror 30y, a hinge 33y mounted at a middle portion of one side face, in Y direction, of the mask θ stage 2 and being rotatably connected to the mask θ stage 2, and a pair of urging force producing means 34y and 34y, each having an urging force producing member 35y such as a compressed spring, for example, and a rod 36y. The paired urging force producing means 34y and 34y are disposed at symmetrical positions on the opposite sides of the hinge 33y. The paired urging force producing members 35y and 35y each has an end fixed to a base plate 2a and another end urging the rod 36y against the surface of the mirror fixing table 32y to press it. The hinge 33y has no or a very small rotation rigidity, but a large rigidity in its axial direction, such that it functions to rotate freely relative to the mask θ stage 2 and to confine its motion in axial direction. Thus, the pair of urging force producing means 34y and 34y function to press the surface of the mirror fixing table 32y at the symmetrical positions on the opposite sides of the hinge 33y, to thereby keep the posture of the mirror fixing table 32y constant. With use of such mirror posture correcting means 31y having paired urging force producing means 34y and 34y, it is assured that, even if the mask θ stage 2 is rotated in θ direction as depicted by a broken line in FIG. 3A, the mirror fixing table 32y keeps its original posture without being moved through the hinge 33y, since the opposite side faces thereof are pressed by the urging force producing means 34y and 34y. As a result, the Y-reference mirror 39y fixed to the mirror fixing table 32y can be kept in constant posture with respect to the measurement laser light. In place of compressed coil spring, the urging force producing means 34y may use an air cylinder, a linear motor, a magnetic force producing member, or an elastmeric member such as a rubber, for example. The hinge 33y may be modified such as is shown in FIG. 3B or 3C. More specifically, a rotation bearing may be used at the hinge, that is, a rotation bearing 33o may be disposed between the mirror fixing table 32 and the ask θ stage 2 so that they can be freely moved relative to each other while any motion along its axial direction is confined.

With the structure as described, that the reference mirror means 30 (30x and 30y) is mounted on the mask θ stage 2 with the intervention of mirror posture correcting means 31 (31x and 31y), the reference mirror 30 (30x and 30y) fixed to the mirror fixing table 32 (32x and 32y) can be kept in a constant posture with respect to the measurement laser light even if the mask θ stage 2 is rotationally moved in a rotational direction along the mask surface. Thus, the measurement laser light from the laser interferometer 20 (20x and 20y) can be reflected constantly in a predetermined direction. This avoids the possibility of failure of detection of the measurement laser light by the photodetector 24 (24x and 24y) and failure of measurement. It is assured therefore that, regardless of rotation of the mask θ stage 2 in the rotational direction along the mask surface, the position or movement amount of the wafer X-Y stage 4 can be measured precisely on the basis of the measurement reference defined by the reference mirror 30, disposed adjacent to the mask 1.

Figure 4:
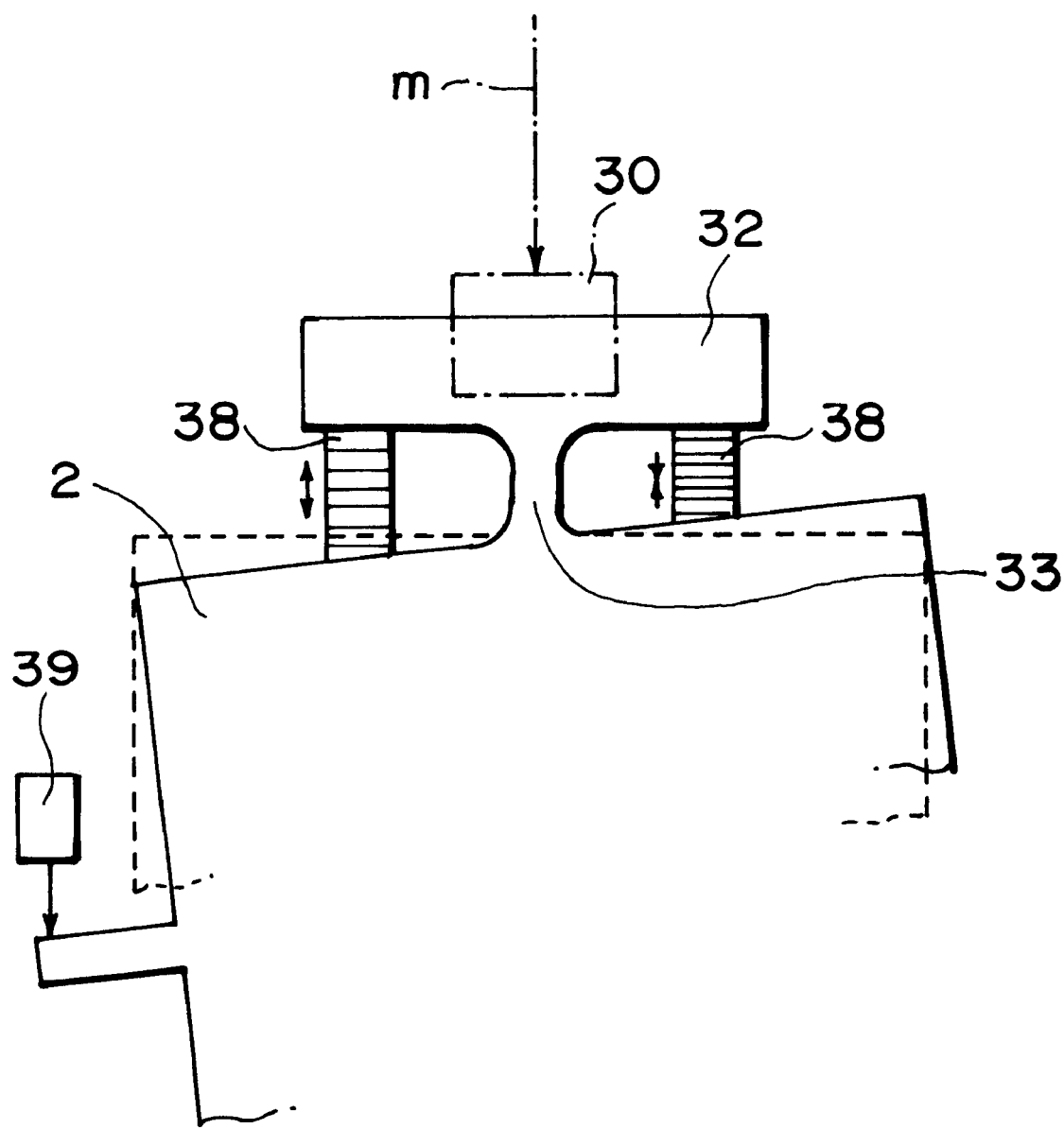
FIG. 4 is a schematic and enlarged view of a main portion of θ driving means for maintaining the posture of a reference mirror in a positioning stage system according to the present invention.

Another example of reference mirror posture maintaining means will be explained, in conjunction with FIG. 4. A mirror fixing table 32 for fixedly holding a reference mirror 30 is mounted at a central portion on one side face of the mask θ stage 2, through a hinge 33. Like the described example, the hinge 33 has no or a very small rotational rigidity, but a large rigidity in its axial direction, such that it can rotate freely relative to the mask θ stage 2 while restricting motion thereof in its axial direction. There are a pair of mirror posture maintaining θ driving means 38 and 38 disposed between the mask θ stage 2 and the mirror fixing table 32, for fixedly holding the reference mirror 30. These θ driving means are placed at symmetrical positions on the opposite sides of the hinge 33. They are actuated in accordance with the result of measurement by an angle sensor 39, which measures the rotational angle of the mask θ stage 2, so that they are expanded or contracted to maintain the posture of the mirror fixing table 32 and the reference mirror 31 constant. The mirror posture maintaining θ driving means may comprise a piezoelectric device, a straight-motion cylinder, an air cylinder or a magnetic driving means, for example.

With the structure described above, when the mask θ stage 2 is rotationally adjusted for mask alignment, for example, the angle sensor 39 measures the rotational angle of the mask θ stage 2 and, in accordance with the result of measurement by the angle sensor 39, the mirror posture maintaining θ driving means 38 and 38 are independently actuated to be expanded or contracted, by which the posture of the mirror fixing table 32 and the reference mirror 30 can be maintained constant. For example, in FIG. 4, the left-hand side mirror posture maintaining θ driving means 38 may be actuated to be expanded to enlarge the spacing between the mirror fixing table 32 and the mask θ stage 2, while the right-hand side mirror posture maintaining 9 driving means 38 may be actuated to be contracted to decrease the spacing between the mirror fixing table 32 and the mask θ stage 2. By using the paired mirror posture maintaining θ driving means in this manner, the reference mirror 30 and the mirror fixing table 32 can be held in constant posture regardless of the rotation of the mask θ stage 2, and, as a result, they can be kept in the same posture with respect to the measurement laser light m.

Referring back to FIG. 2, measurement of the position (movement amount) of the wafer X-Y stage 4 with respect to X and Y directions by means of the X-axis laser interferometer 20x and Y-axis laser interferometer 20y will be explained. Laser light my emitted from the laser oscillator 21y of the Y-axis laser interferometer 20y is deflected by the right-angle mirror 25y toward the polarization beam splitter 22y, and it is divided by this beam splitter. A portion of the laser light my is transmitted through the polarization beam splitter 22y, and it is projected on the Y measurement mirror 11 on the wafer X-Y stage 4 (target to be measured). The remaining portion of the laser light my is reflected by the polarization beam splitter 22y and, via the right-angle mirror 23y, it is projected on the Y-reference mirror 31y. Light reflected by this Y-reference mirror 31y goes through the polarization beam splitter 22y, while light reflected by the Y measurement mirror 11 is reflected by the polarization beam splitter 22y. Both of these laser lights are projected on the photodetector 24y. The laser lights impinging on the photodetector 24y interfere with each other to produce interference fringes. By counting the fringes with the photodetector 24y, the position (movement amount) of the wafer X-Y stage 4 (target to be measured) having the Y measurement mirror 11 mounted thereon, with respect to the Y direction can be measured. Measurement of the position (movement amount) of the wafer X-Y stage 4 with respect to the X direction can be measured similarly, by means of the X-axis laser interferometer 20x.

As described above, the X or Y reference mirror 30 (30x and 30y) for providing a measurement reference for the laser interferometer means 20 (20x and 20y), measuring the position or movement amount of the wafer X-Y stage 4 with respect to X or Y direction, is mounted on the mask θ stage 2 through the mirror posture correcting means 31 (31x and 31y) or mirror posture maintaining θ driving means 38. As a result, even when the mask θ stage 2 is rotationally driven through the θ driving means 7 so as to absorb a manufacturing error or conveyance error of the mask 1, it is rotated relatively to the mask θ stage 2 and keeps the same posture with respect to the measurement laser light. Thus, the laser light impinging on the reference mirror 30 (30x and 30y) can be reflected constantly in the same direction as the impingement thereof. This assuredly prevents failure of impingement of reflected measurement laser light on the photodetector means and thus failure of measurement. Therefore, the position or movement amount of the wafer X-Y stage 4 with respect to the X or Y direction can be measured precisely, on the basis of the measurement reference defined by reference mirror 30 (30x and 30y).

Next, an X-ray exposure apparatus having a stage positioning system with a structure as having been described with reference to FIGS. 1 and 2, will be explained. A mask 1 having a pattern formed thereon is placed on the mask θ stage 2, and alignment thereof is performed. Here, the mask θ stage 2 is drivingly adjusted by the θ driving means 7 in a rotational direction along the mask surface, so as to absorb any mask manufacturing error or conveyance error. A wafer 3 is held by the wafer X-Y stage 4 through the wafer chuck 5, and it is moved by the wafer X-Y stage 4 so that a predetermined exposure shot is placed at the exposure region, opposed to the mask 1. Here, the position of the wafer 3 with respect to X and Y directions is measured by means of the laser interferometer 20 (20x and 20y), and the wafer X-Y stage 4 is driven in accordance with the result of measurement. The position of the wafer X-Y stage 4 is thus controlled. The X-ray beam L of exposure light, which may be a synchrotron radiation beam emitted from a light source such as an electron accumulation ring (not shown), for example, serves to lithographically transfer the pattern of the mask 1 held by the mask θ stage 2 onto the wafer 3 held by the wafer X-Y stage 4. The position of the wafer 3 with respect to X and Y directions is measured continuously even during the exposure process, by means of the laser interferometer 20 (20x and 20y), and the wafer X-Y stage 4 is driven in accordance with the result of measurement. This enables accurate control of the alignment between the wafer 3 and the mask 1.

In mask alignment adjustment in which the mask θ stage 2 is rotationally moved in a rotational direction along the mask surface so as to absorb any mask manufacturing error or conveyance error, there is a possibility that the rotation of the mask 1 and the mask θ stage produces other components in X and Y directions, which in turn, cause displacement of the reference of the wafer X-Y stage 2. This may result in failure of accurate measurement of the position or movement amount of the wafer-X-Y stage 4 or of the wafer 3 with respect to X and Y directions. A correcting method therefor, as other components in the measurement direction are produced when the reference mirror is mounted on the mask θ stage 2, will be explained below in conjunction with FIGS. 1 and 2.

The mask θ stage 2 is rotated by the θ driving means 7 in θ direction so as to adjust the posture of the mask 1, and the rotational angle θ thereof is detected by the θ angle sensor 9. In consideration of it, other components in the X and Y directions, to be produced in response to the rotational angle caused by rotational driving are measured beforehand. On the basis of this, the relationship between the angle θ and the other components is detected and the correction amounts corresponding to these angles are calculated beforehand. In an actual exposure process, when the position (movement amount) of the wafer X-Y stage 4 is measured by using the laser interferometer 20 (20x and 20y), the rotational angle θ of the mask θ stage 2 is also detected by using the θ angle sensor 9, and the correction amount corresponding to the thus detected angle θ is read out. Then, the measured value obtained through the laser interferometer 20 (20x and 20y) is corrected on the basis of the correction value and, in accordance with the result of correction, the driving means (not shown) for the wafer X-Y stage 4 in X and Y directions is actuated to move the wafer X-Y stage 4 in X and Y directions. This enables higher precision positioning of the wafer X-Y stage 4, regardless of other components in measurement direction of the reference mirror.

Another correction method may be that the mask positioning is completed prior to the exposure so that no mask drive is performed in the exposure process, avoiding other components in the X and Y directions in the exposure process. More specifically, the mask alignment adjustment may be performed before the exposure process, and any θ displacement of the mask produced there is measured and corrected. Although this adjustment may produce other components and, as a result, the reference position of the wafer X-Y stage 4 may be displaced, the position or movement amount of the wafer X-Y stage 4 may be measured in this state and then the positioning of the wafer X-Y stage 4 may be performed. In that case, the wafer X-Y stage 4 is positioned on the basis of the reference position being deviated due to θ motion of the mask 1, so that it follows the thus deviated reference position. As regards such positional deviation, however, in the wafer alignment operation where alignment marks of the wafer 3 and alignment marks of the mask 1 are brought into alignment with each other, the position correction may be performed also to correct the other component deviation produced during the mask alignment. During the exposure process, the exposure is performed without mask driving adjustment. By correcting the other component deviation produced by the mask alignment, during the procedure of a wafer alignment operation, higher precision positioning of the wafer X-Y stage is assured similarly.

An alternative correction method may be that the mask positioning is completed prior to the exposure process, such that the exposure is performed without mask driving. The position measurement for the wafer X-Y stage may be made after completion of the mask positioning, so that an other component in X and Y direction may be produced during the exposure process. More specifically, the mask alignment adjustment may be made before the exposure, and a rotational angle of the mask produced there may be measured and corrected. While this adjustment causes other components, the position measurement for the wafer X-Y stage may be made after completion of the mask positioning and by using the mask position as a reference. Then, alignment marks of the wafer and alignment marks of the mask may be brought into alignment, and the exposure may be performed. The exposure may be done without mask driving adjustment. This enables higher precision positioning of the wafer X-Y stage.

Next, another embodiment of the positioning stage system according to the present invention will be described. This embodiment is directed to a positioning stage system with a mask tilt stage having freedom in the tilt direction along the mask surface. A description will be made in conjunction with FIG. 5.

Figure 5:
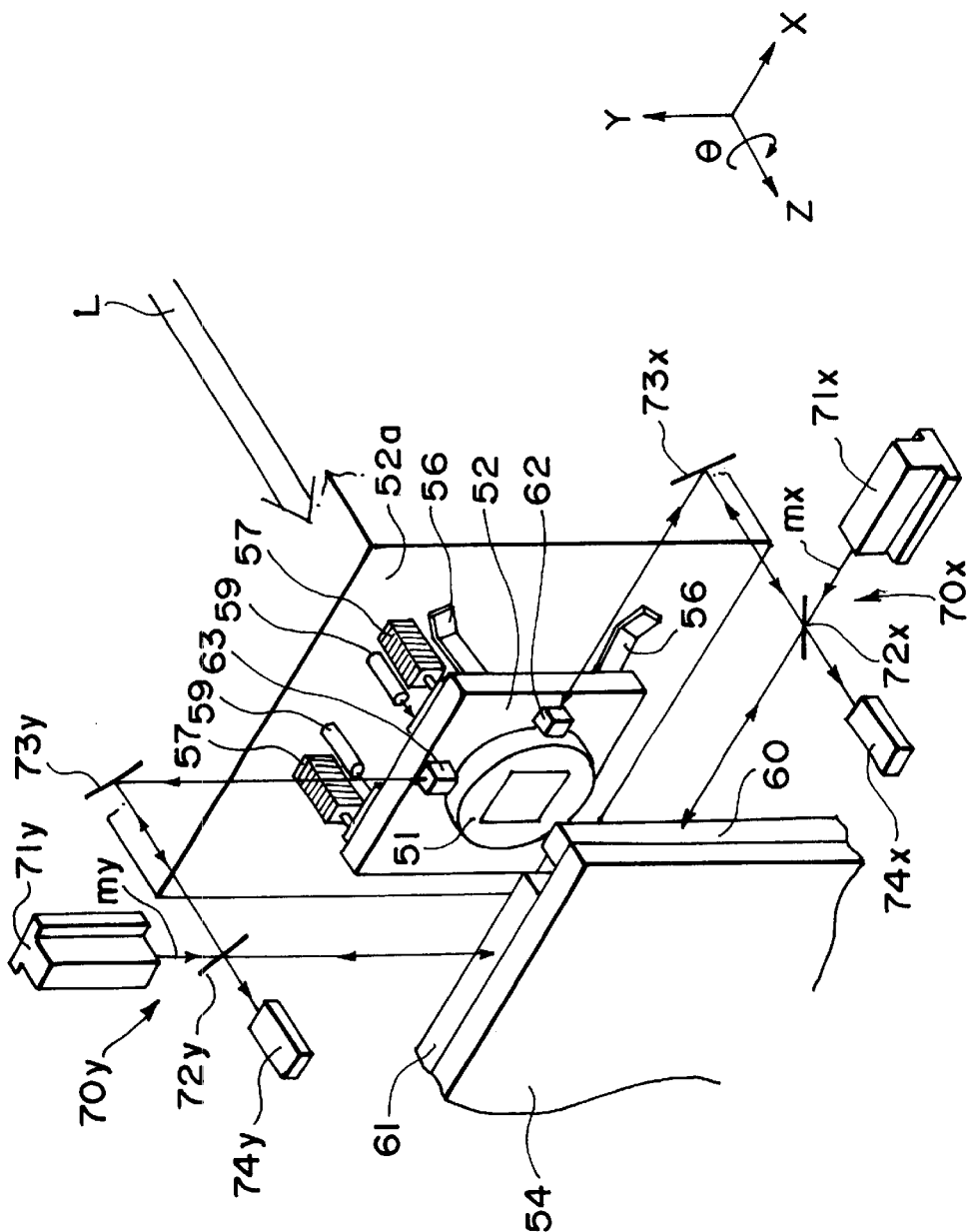
FIG. 5 is a schematic and perspective view of another embodiment wherein a stage positioning system according to the present invention is incorporated into an X-ray exposure apparatus.

In FIG. 5, along a path of X-ray beam L (exposure light), which is emitted from a light source (not shown), a mask tilt stage 52 for holding a mask 51 and a wafer X-Y stage 54 (partially illustrated) for holding a wafer or substrate (not shown) are disposed close to each other. The mask tilt stage 52 for holding the mask 51 is mounted on a base plate 52a through four leaf spring guides 56, 56, . . . , disposed at four corners, so that it can absorb a wedge component of the mask 51. Disposed between the base plate 52a and the mask tilt stage 52 are a plurality of tilt driving means 57, 57, . . . , each comprising a piezoelectric device. By actuating these tilt driving means 57 appropriately, the mask tilt stage 52 can be tilted. The tilt of the mask tilt stage 52 is detected by means of tilt sensors 59 and 59.

At the mask tilt stage side, there are an X-reference corner cube 62 and a Y-reference corner cube 63, which function as reference mirrors with respect to the X and Y directions, respectively. These corner cubes are disposed close to the mask 51 on the mask tilt stage 52, or they are mounted on the mask 51 itself. The wafer X-Y stage 54 is provided with an X measurement mirror 60 and a Y measurement mirror 61.

An X-axis laser interferometer 70x serves to measure the position or movement amount of the wafer X-Y stage 54 with respect to the X direction. It comprises a laser oscillator 71x for emitting measurement laser light mx, the X measuring mirror 60 mounted on the wafer X-Y stage 54 (target to be measured), an X-reference corner cube 62 for providing a measurement reference and being mounted on the mask tilt stage 52, a polarization beam splitter 72x disposed between the laser oscillator 71x and the X measuring mirror 60, a right-angle mirror 73x for directing a portion of the laser light mx, being divided by the polarization beam splitter 72x, toward the X-reference corner cube 62, and a photodetector 74x. Thus, the laser light mx emitted by the laser oscillator 71x is divided by the polarization beam splitter 72x. A portion of the laser light mx is transmitted through the polarization beam splitter 72x, and it is projected on the X measurement mirror 60 on the wafer X-Y stage 54. The remaining portion of the laser light mx is reflected by the polarization beam splitter 72x, and via the right-angle mirror 73x it is projected onto the X-reference corner cube 62, which provides a reference mirror. Light reflected by the X-reference corner cube 62 goes through the polarization beam splitter 72x, while light reflected by the X measurement mirror 60 is reflected by the polarization beam splitter 72x, and both lights are projected on the photodetector 74x. These laser lights projected on the photodetector 74x interfere with each other, to produce interference fringes. By counting the fringes with the photodetector 74x, the position and movement amount of the wafer X-Y stage 54 (target to be measured), having the X measurement mirror 60 mounted thereon, with respect to the X direction can be measured.

A Y-axis laser interferometer 70y serves to measure the position and movement amount of the wafer X-Y stage 54 with respect to the Y direction. It has a similar structure, and functions similarly to measure the position and movement amount of the wafer X-Y stage 54 (target to be measured), having the Y measurement mirror 61 mounted thereon, with respect to the Y direction.

As described above, the reference corner cubes 62 and 63, which provide measurement references for the laser interferometer means 70 (70x and 70y), measuring the position or movement amount of the wafer X-Y stage 54 with respect to X or Y direction, are disposed on the tiltable mask tilt stage 52. As a result, even when the mask tilt stage 52 tilts in the tilt direction along the mask surface to cause inclination of the corner cubes 62 and 63 (reference mirrors), it is assured that the corner cubes 62 and 63 reflect the incident laser light in the same direction. This assuredly prevents failure of impingement of reflected measurement laser light on the photodetector means 74 and thus failure of measurement.

Figure 6:
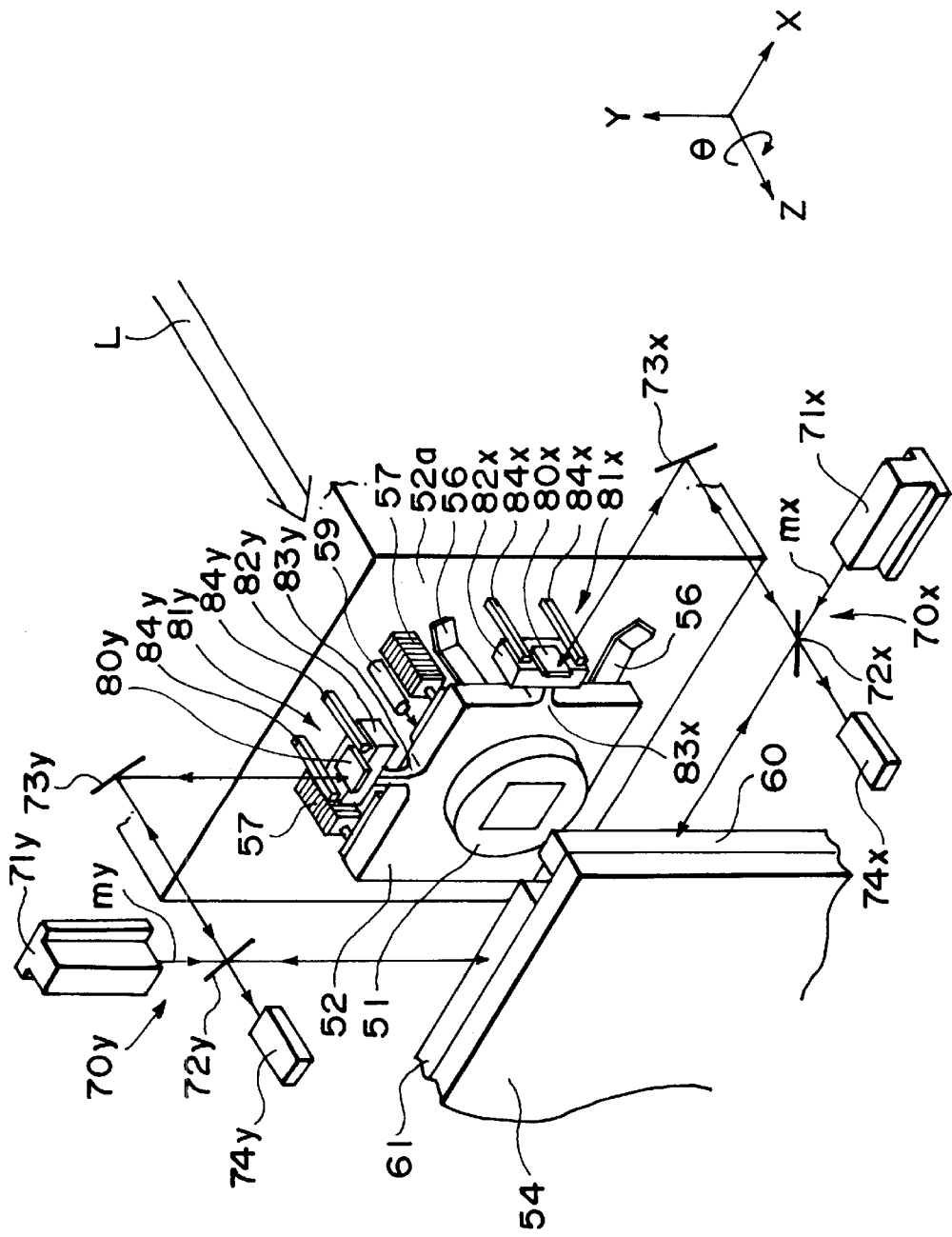
FIG. 6 is a schematic and perspective view of a further embodiment wherein a stage positioning system according to the present invention is incorporated into an X-ray exposure apparatus.

Referring now to FIG. 6, a further embodiment of positioning stage system according to the present invention will be described. The embodiment shown in FIG. 6 differs from the embodiment of FIG. 5 in that a reference mirror to be provided on a mask tilt stage is mounted through mirror posture correcting means. In this embodiment, the elements corresponding to those of the FIG. 5 embodiment are denoted by like numerals. A detailed description therefor will be omitted.

In FIG. 6, an X-reference mirror 80x and a Y-reference mirror 80y are mounted on a mask tilt stage 52 through X-mirror posture correcting means 81x and Y-mirror posture correcting means 81y, respectively. The positions of the X-mirror posture correcting means 81x and Y-mirror posture correcting means 81y mounted on the mask tilt stage 52 are different, but they are structured with similar components. Like numerals are assigned to corresponding elements, with suffixes x and y.

Details of the Y-reference mirror 80y and the Y-mirror posture correcting means 81y will now be explained. The Y-reference mirror 80y is held by the Y-mirror posture correcting means 81y disposed at a central portion on one side face, in the Y direction, of the mask tilt stage 52. The Y-mirror posture correcting means 81y comprises a Y-mirror fixing table 82y for fixing the Y-reference mirror 80y, a hinge 83y mounted at a middle portion of one side face, in the Y direction, of the mask tilt stage 52 and being rotatably connected to the mask tilt stage 52, and a pair of urging force producing means 84y and 84y for pressing the surface of the Y-mirror fixing table 82y in Y direction. The paired urging force producing means 84y and 84y are disposed at symmetrical positions on the opposite sides of the hinge 83y. They engage with the surface of the mirror fixing table 82y to press the respective engagement positions downwardly along the Y direction, whereby the posture of the mirror fixing table 82y can be held constant. As a result, the Y-reference mirror 80y fixed to the mirror fixing table 82y can also be kept in constant posture, and it is held constantly in a posture perpendicular to the measurement laser light.

Thus, by using the mirror posture correcting means 81y such as described above, the mirror fixing table 83y can be held in a constant posture even if the mask tilt stage 52 tilts in the tilt direction along the mask surface, since the mirror fixing table 83y is pressed at its opposite sides by the paired urging force producing means 84y and 84y. Thus, the Y-reference mirror 80y also can be held in a constant posture.

With the structure, as described, that the reference mirror means 80 (80x and 80y), which provides a measurement reference for the laser interferometer 70 (70x and 70y) for measuring the position or movement amount of the wafer X-Y stage 54, are mounted on the mask tilt stage 52 with the intervention of mirror posture correcting means 81 (81x and 81y), the reference mirror 80 can be kept in a constant posture. This is because, even if the mask tilt stage 52 tilts in the tilt direction along the mask surface, the reference mirror 80 rotates relatively to the mask tilt stage 52. Thus, the measurement laser light impinging on the reference mirror can be reflected constantly in a predetermined direction. This avoids the possibility of failure of detection of the measurement laser light by the photodetector 74 and failure of measurement. It is assured therefore that, regardless of the tilt of the mask tilt stage 52 in the tilt direction along the mask surface, the position or movement amount of the wafer X-Y stage 54 can be measured precisely on the basis of the measurement reference defined by the reference mirror 80.

The embodiments shown in FIGS. 5 and 6 use an optical system for distributing laser light, emitted from a laser oscillator, to reference mirrors, so that reflected lights from these mirrors are detected by one and the same photodetector. However, a laser interferometer having a reference mirror accommodated therein may be used. More specifically, with regard to the two reference mirrors, there may be two such independent laser interferometers independent, to measure the position or movement amount of the wafer stage.

Next, an X-ray exposure apparatus having a stage positioning system with a structure as having been described with reference, to FIGS. 5 and 6, will be explained. A mask 51 having a pattern formed thereon is placed on the mask tilt stage 52, and alignment thereof is performed. Here, the mask tilt stage 52 is drivingly adjusted by the tilt driving means 57 in the tilt direction along the mask surface, so as to absorb any wedge component of the mask. A wafer (not shown) is held by the wafer X-Y stage 54 through the wafer chuck, and it is moved by the wafer X-Y stage 54 so that a predetermined exposure shot is placed at the exposure region, opposed to the mask 51. Here, the position of the wafer with respect to X and Y directions is measured by means of the laser interferometer 70 (70x and 70y), and the wafer X-Y stage 54 is driven in accordance with the result of measurement. The position of the wafer X-Y stage 54 is thus controlled. The X-ray beam L of exposure light, which may be a synchrotron radiation beam emitted from a light source, such as an electron accumulation ring (not shown), for example, serves to lithographically transfer the pattern of the mask 51 held by the mask tilt stage 52 onto the wafer held by the wafer X-Y stage 54. The position of the wafer with respect to X and Y directions is measured continuously even during the exposure process, by means of the laser interferometer 70 (70x and 70y), and the wafer X-Y stage 54 is driven in accordance with the result of measurement. This enables accurate control of the alignment between the wafer and the mask 51.

In mask alignment adjustment in which the mask tilt stage 52 is tilted in the tilt direction along the mask surface so as to absorb any wedge component of the mask, there is a possibility that the tilt motion of the mask 51 produces other components in X and Y directions, which in turn, cause displacement of the reference of the wafer X-Y stage 54. This may result in failure of accurate measurement of the position or movement amount of the wafer X-Y stage 54 with respect to X and Y directions. However, the components in the measurement direction of the reference mirror such as described above can be corrected in a similar way as has been described with reference to FIGS. 1 and 2. Thus, higher precision positioning of the wafer X-Y stage can be accomplished, regardless of any tilt of the mask tilt stage 52 in the tilt direction along the mask surface.

Next, an embodiment of a device manufacturing method which uses an X-ray exposure apparatus such as described above, will be explained.

Figure 7:
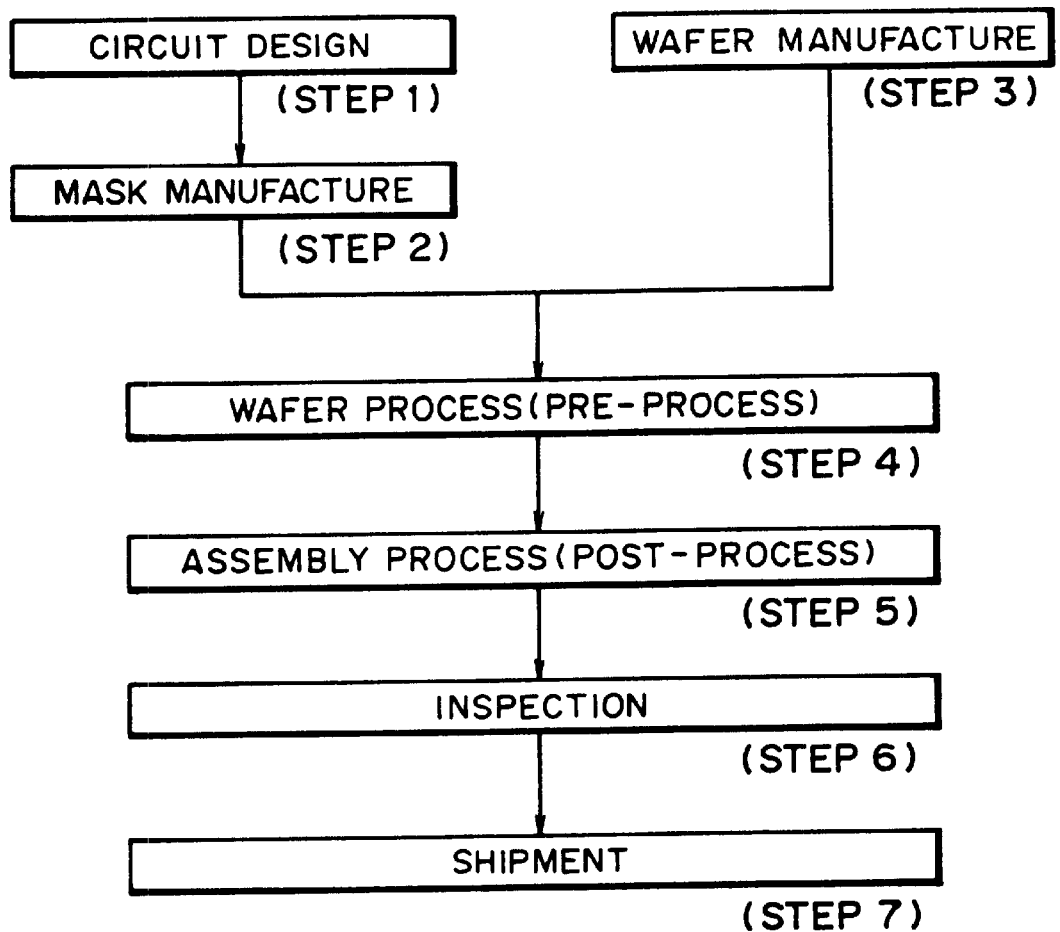
FIG. 7 is a flow chart of semiconductor device manufacturing processes.

FIG. 7 is a flow chart of procedure for manufacture of microdevices such as semiconductor chips (e.g. ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step, which is called a post-process, wherein the wafer having been processed by step 4 is formed into semiconductor chips. This step includes assembling (dicing and bonding) process and packaging (chip sealing) process. Step 6 is an inspection step wherein an operation check, a durability check, sand so on for the semiconductor devices provided by step 5, are carried out. With these processes, semiconductor devices are completed and they are shipped (step 7).

Figure 8:
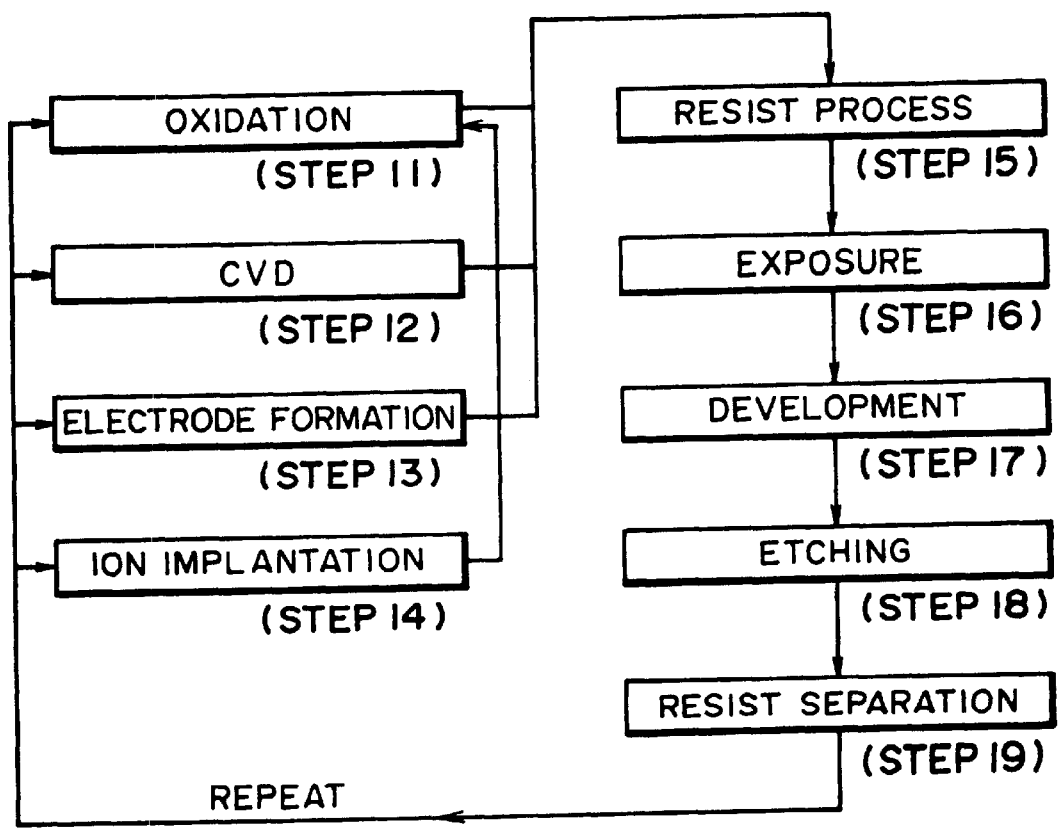
FIG. 8 is a flow chart of a wafer process.

FIG. 8 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer. With these processes, high density microdevices can be manufactured with a lower cost.

As described hereinbefore, a corner cube or a cat's-eye may be used as a reference mirror. The reference mirror may be mounted on a first positioning stage through mirror posture correcting means or mirror posture maintaining driving means. This assures that the reference mirror is held in a constant posture with respect to measurement laser light. Thus, even if the reference mirror displaces in a rotational direction or a tilt direction together with the first positioning stage, the position or movement amount of a measurement mirror provided on a second positioning stage can be measured constantly with good precision. As a result, the second positioning stage can be positioned precisely.

The present invention is applicable to an X-ray exposure apparatus, and the position or movement amount of a substrate, stage for holding a substrate such as a wafer, can be measured precisely while using a reference mirror, disposed on or adjacent a mask, as a measurement reference, regardless of displacement of a mask stage for holding the mask and being movable in a rotational direction or tilt direction along the mask surface. Although displacement of the mask or mask stage in the rotational direction or the tilt direction along the mask surface may produce other components in X and Y directions of the reference mirror, which in turn, may cause a shift of the positioning reference for the substrate stage, the substrate stage can still be driven and positioned precisely by correcting, for example, a measured of the position or movement amount of the substrate stage on the basis of measurement of the mask stage. Thus, the mask to substrate alignment can still be controlled very precisely.

While the invention has been described with reference to the structures disclosed herein, it is not confined to the details set forth and this application is intended to cover such modifications or changes as may come within the purposes of the improvements or the scope of the following claims.

What is claimed is:

1. An apparatus comprising:
    a mask stage for holding a mask and being movable at least in one of a rotational direction along the mask surface and a tilt direction to the mask surface;
    a substrate stage for holding a substrate, to be exposed, and being movable in X and Y directions along an X-Y plane parallel to the substrate surface;
    a measurement mirror system fixed to said substrate stage;
    a reference mirror system disposed on said mask stage; and
    a measuring system for measuring displacement of said measurement mirror system in the X or Y direction, while using said reference mirror system as a positional reference, and on the basis of laser interference;
    wherein the substrate on said substrate stage can be aligned with respect to the mask on the basis of the measurement by said measuring system, and a pattern of the aligned mask can be transferred and printed onto the substrate; and wherein said reference mirror system is arranged so that laser light incident on said reference mirror system is reflected in the same direction as the incidence direction of the laser light, substantially constantly; and
    wherein information related to a positional error, in X and Y directions, of said reference mirror system due to rotation or a change in tilt of the mask stage is detected beforehand in relation to a drive amount of said mask stage, and wherein said measuring system has a function for correcting a measured value in accordance with the drive amount of said mask stage.

2. An apparatus to claim 1, wherein the pattern transfer is made by use of X-rays.

3. An apparatus according to claim 1, wherein said reference mirror system includes retroreflectors.

4. An apparatus according to claim 3, wherein said retroreflectors comprise a corner cube or a cat's-eye optical system.

5. An apparatus according to claim 1, wherein said mask stage is controlled so that it is not driven during the projection exposure of the mask pattern to the substrate to be exposed.

6. A device manufacturing method, comprising the steps of:
    transferring, by exposure, a pattern of a mask onto a substrate by use of an exposure apparatus including (i) a mask stage for holding the mask and being movable at least in one of a rotational direction along the mask surface and a tilt direction to the mask surface, (ii) a substrate stage for holding the substrate, to be exposed, and being movable in X and Y directions along an X-Y plane parallel to the substrate surface, (iii) a measurement mirror system fixed to the substrate stage, (iv) a reference mirror system disposed on the mask stage, and (v) a measuring system for measuring displacement of the measurement mirror system in the X or Y direction, while using the reference mirror system as a positional reference, and on the basis of laser interference, wherein the substrate on the substrate stage can be aligned with respect to the mask on the basis of the measurement by the measuring system, and a pattern of the aligned mask can be transferred and printed onto the substrate, and wherein the reference mirror system is arranged so that laser light incident on the reference mirror system is reflected in the same direction as the incidence direction of the laser light, substantially constantly;
    developing the exposed substrate, whereby a device can be produced from the substrate; and
    detecting beforehand information related to a positional error, in X and Y directions, of said reference mirror system due to rotation or a change in tilt of the mask stage in relation to a drive amount of said mask stage, and wherein said measuring system has a function for correcting a measured value in accordance with the drive amount of said mask stage.

7. A method according to claim 6, wherein the mask stage is not driven during the projection exposure of the mask pattern to the substrate to be exposed.

8. An apparatus to claim 6, wherein the pattern transfer is made by use of X-rays.

* * * * *

UNITED STATES PATENT AND TRADEMARK OFFICE
CERTIFICATE OF CORRECTION

PATENT NO. : 6,404,505 B2
DATED : June 11, 2002
INVENTOR(S) : Shin Matsui

It is certified that error appears in the above-identified patent and that said Letters Patent is hereby corrected as shown below:

<u>Column 2,</u>
Line 43, "avoiding" should read -- avoid --.

<u>Column 4,</u>
Line 9, "the," should read -- the --.
Line 63, "mask 9 stage 2" should read -- mask θ stage 2 --.

<u>Column 5,</u>
Line 17, "positioning stage" should read -- a stage positioning --.

<u>Column 6,</u>
Line 6, "elastmeric" should read -- elastomeric --.
Line 10, "ask θ" should read -- mask θ --.
Line 66, "maintaining 9" should read -- maintaining θ --.

<u>Column 9,</u>
Line 19, "an other" should read -- another --.

<u>Column 11,</u>
Line 53, "interferometers" should read -- interferometers, --.
Line 54, "independent," should be deleted.

<u>Column 12,</u>
Line 51, "sand" should read -- and --.

<u>Column 13,</u>
Line 34, "measured" should read -- measurement --.

UNITED STATES PATENT AND TRADEMARK OFFICE
CERTIFICATE OF CORRECTION

PATENT NO.   : 6,404,505 B2
DATED        : June 11, 2002
INVENTOR(S)  : Shin Matsui It is certified that error appears in the above-identified patent and that said Letters Patent is hereby corrected as shown below:

<u>Column 14,</u>
Line 60, "An apparatus to" should read -- A method according to --.

Signed and Sealed this

Seventh Day of January, 2003

JAMES E. ROGAN
*Director of the United States Patent and Trademark Office*